United States Patent [19]

Ohba

[11] Patent Number: 5,239,507
[45] Date of Patent: Aug. 24, 1993

[54] SEMICONDUCTOR MEMORY DEVICE WITH READOUT DATA BUSES CONNECTING LOCAL AND MAIN SENSE AMPLIFIERS

[75] Inventor: Atsushi Ohba, Hyogo, Japan

[73] Assignee: Mitsubishi Denki Kabushiki Kaisha, Tokyo, Japan

[21] Appl. No.: 654,122

[22] Filed: Feb. 12, 1991

[30] Foreign Application Priority Data

Feb. 15, 1990 [JP] Japan .................................. 2-34561
Jan. 28, 1991 [JP] Japan .................................. 3-008712

[51] Int. Cl.⁵ .............................................. G11C 7/00
[52] U.S. Cl. ................................ 365/189.06; 365/207
[58] Field of Search ................... 307/530; 365/189.01, 365/189.06, 207, 225.6

[56] References Cited

U.S. PATENT DOCUMENTS 4,866,674  9/1989  Tran ................................ 365/207 X
4,907,203  3/1990  Wada et al. ...................... 365/238.5
5,093,806  3/1992  Tran ............................ 365/189.06 X

FOREIGN PATENT DOCUMENTS 61-190786  8/1986  Japan .
62-28516   6/1987  Japan .

Primary Examiner—Steven Mottola
Attorney, Agent, or Firm—Lowe, Price, LeBlanc & Becker

[57] ABSTRACT

Readout data amplified by each local sense amplifier is provided to the corresponding readout data bus. Each readout data bus is connected to a plurality of main sense amplifiers (for example, a main sense amplifier for x1 and a main sense amplifier for x2). Each main sense amplifier includes a clamp transistor for clamping the potential of the readout data bus always to a constant potential, whereby increase in speed of readout data is performed by the clamp transistor. The base potential of the clamp transistor in each main sense amplifier is controlled in response to a switching control signal. As a result, a plurality of main sense amplifiers connected to one readout data bus are switched selectively.

17 Claims, 16 Drawing Sheets

DIP/SOJ (256K x 1ECL RAM)

ALL OTHER PINS ARE "A"

FLAT PACKAGE ( 256K x 1ECL RAM )

SEMICONDUCTOR MEMORY DEVICE WITH READOUT DATA BUSES CONNECTING LOCAL AND MAIN SENSE AMPLIFIERS

BACKGROUND OF THE INVENTION

1. Field of the Invention

The present invention relates generally to semiconductor memory devices, and more particularly to a semiconductor memory device capable of switching modes according to the usage environment.

2. Description of the Background Art

FIG. 5 is a partial diagram of a conventional SRAM (Static Random Access Memory) disclosed in Japanese Patent Laying-Open No. 61-190786. FIG. 5 shows the structure of a 4row-4column SRAM as an example. Referring to FIG. 5, an X decoder 1 is responsive to an entry of an X address to provide a signal activating any of NOR gates 2a-2d in a word line actuating circuit 2. The output of NOR gates 2a-2d is provided to word lines 3a-3d, respectively. A Y decoder 4 is responsive to an entry of a Y address to provide a signal activating any of NOR gates 5a-5d in a bit line actuating circuit 5. Four bit line pairs of 6a and 6b-9a and 9b are provided to cross word lines 3a-3d arranged in parallel. Memory cells MC00, MC01, . . . , MC33 are provided at each intersection of the word line and the bit line pair. For example, a high resistance load type memory cell of FIG. 6, a CMOS type memory cell of FIG. 7, and the like are used as one of the above mentioned memory cells. A bit line pair 6a and 6b is connected to a first voltage supply 15 via bit line load transistors 10a and 10b, as well as to an I/O line pair 20a and 20b via transfer gates 16a and 16b. A bit line pair 7a and 7b is connected to first voltage supply 15 via bit line load transistors 11a and 11b, as well as to an I/O bit line pair 20a and 20b via transfer gates 17a and 17b. A bit line pairs 8a and 8b is connected to first voltage supply 15 via bit line load transistors 12a and 12b, as well as to I/O line pair 20a and 20b via transfer gates 18a and 18b. A bit line pair 9a and 9b is connected to first voltage supply 15 via bit line load transistors 13a and 13b, as well as to I/O line pair 20a and 20b via transfer gates 19a and 19b. The outputs of NOR gate 5a, NOR gate 5b, NOR gate 5c, and NOR gate 5d in bit line actuating circuit 5 are applied to the gates of the transfer gates 16a and 16b, 17a and 17b, 18a and 18b, 19a and 19b, respectively.

A local sense amplifier 21 is a current output type differential amplifier for amplifying the potential difference of I/O lines 20a and 20b and providing the same as a current signal. Local sense amplifier 21 is activated on receiving the output of a local sense amplifier selecting circuit 22. Local sense amplifier 21 is implemented with transistors 21a, 21b and 21c. I/O lines 20a and 20b are connected to the bases of transistors 21a, and 21b, respectively. The emitters of transistors 21a and 21b are connected to a second voltage supply 30 via transistor 21c. The gate of transistor 21c is supplied with the output of local sense amplifier selecting circuit 22. The collectors of transistors 21a and 21b are connected to readout data buses 23a and 23b, respectively.

A writing driver 29 is responsive to outputs 32a and 32b of a writing amplifier 31 for bringing one of I/O lines 20a and 20b to a high level, and the other to a low level. Writing driver 29 is implemented with transistors 25-28. Transistor 25 has the drain connected to first voltage supply 15 and the source connected I/O line 20a. Transistor 26 has the drain connected to I/O line 20a and the source connected to second voltage supply 30. Transistor 27 has the drain connected to first voltage supply 15 and the source connected to I/O line 20b. Transistor 28 has the drain connected to I/O line 20b and the source connected to the second voltage supply 30. Outputs 32a and 32b of writing amplifier 31 are applied to the gates of transistors 25 and 28, and transistors 26 and 27, respectively.

A clamp potential generating circuit 33 generates a control potential for transistors 40a and 40b to clamp the potentials of readout data buses 23a and 23b. Clamp potential generating circuit 33 is implemented with a diode 34, a resistor 36, and a transistor 37. Diode 34 has its anode connected to first voltage supply 15. The base of transistor 37 is applied with a reference potential for generating constant current via a terminal 35. Transistor 37 has the collector connected to the cathode of diode 34, and the emitter connected to second voltage supply 30 via resistor 36.

A main sense amplifier 38 is a voltage output type amplifier for amplifying current signals passing readout data buses 23a and 23b to invert the same into voltage signals. Main sense amplifier 38 comprises resistors 39a and 39b having one end connected to first voltage supply 15; and transistors 40a and 40b having the base supplied with the output of clamp potential generating circuit 33, the emitter connected to readout data buses 23a and 23b, and the collector connected to the other ends of resistors 39a and 39b. Transistors 40a and 40b are used as clamp transistors for readout data buses 23a and 23b. Main sense amplifier 38 further comprises emitter-follower-transistors 41a and 41b having the bases supplied with the outputs of resistors 39a and 39b, diodes 42a and 42b for level shifting having the anodes connected to the emitters of transistors 41a and 41b, and current source circuits 43-46 connected to establish a constant current source with a transistor and a resistor.

The output of main sense amplifier 38 is applied to an output circuit 47 operating at an ECL (Emitter Coupled Logic) level.

The operation of the conventional semiconductor memory device of FIG. 5 is described hereinafter.

When memory cell MC00 is to be selected for example, signals of a low level are applied to the two inputs of NOR gate 2a in word line actuating circuit 2 from X decoder 1. In response, the output of NOR gate 2a attains a high level to bring word line 3a to a high level. At least one of the two inputs of other NOR gates 2b–2d in word line actuating circuit 2 is supplied with a signal of a high level. This brings the other word lines 3b–3d to a low level. By this operation, word lines 3a is selected. The selection of a bit line is carried out in a similar manner. That is to say, signals of a low level are provided to the two inputs of NOR gate 5a in bit line actuating circuit 5, whereby the output of NOR gate 5a attains a high level. In response, transfer gates 16a and 16b are conductive to select bit line pair 6a and 6b.

FIG. 8 is a diagram of memory cell MC00 of FIG. 5 and the relating reading/writing system. The operation of reading from or writing to the selected memory cell MC00 a data signal is described hereinafter with reference to FIG. 8.

It is assumed that the internal node N1 of memory cell MC00 is at a high level, and node N2 is at a low level. Transistor Q1 in the memory cell is non-conductive, and transistor Q2 is conductive at this time.

When reading, outputs 32a and 32b of writing amplifier 31 are both fixed to the low level. When word line 3a is selected at a high level, transfer gates Q3 and Q4 of memory cell MC00 are both conductive. For example, if the potential of first voltage supply 15 is GND (=0 V) and the potential of second voltage supply 30 is VEE, potential VB1 of bit line 6a is VB1= −VLS. VLS indicates the drop of voltage when current does not flow through bit line load transistor 10a. Potential VB2 of bit line 6b falls down an extra $\Delta^V$ in voltage due to ON resistance of bit line load transistor 10b, to result in VB2= −$\Delta^V$−VLS. $\Delta^V$ is called the bit line amplitude, and is usually 50 mV–500 mV. $\Delta^V$ is adjusted according to the magnitudes of the bit line load transistors 10a and 10b. This bit line amplitude appears on I/O lines 20a and 20b via transfer gates 16a and 16b.

The above bit line amplitude is amplified by local sense amplifier 21 and provided to readout data buses 23a and 23b as a current signal. More specifically, bit line 6a is at a high level and bit line 6b is at a low level, to bring I/O line 20a to a high level and I/O line 20b to a low level. This causes transistor 21a connected to I/O line 20a to become conductive, and transistor 21b connected to I/O line 20b to become non-conductive in local sense amplifier 21. Therefore, when transistor 21c is turned on by the output of sense amplifier selecting circuit 22, sensing current flows through readout data line 23a, but not through readout data line 23b.

The potentials of readout data buses 23a and 23b are clamped to a constant potential VCL by clamp potential generating circuit 33 and readout data bus clamp transistors 40a and 40b. Clamp potential VCL is determined by output potential −VD of clamp potential generating circuit 33 and the voltage VBE between the base and emitter of readout data bus clamp transistors 40a and 40b. More specifically, VCL= −VD−VBE.

The readout rate is increased in speed due to the potentials of readout data buses 23a and 23b clamped to a constant potential VCL by readout data bus clamp transistors 40a and 40b. The reason for this benefit is described hereinafter with reference to an equivalent circuit of FIG. 9.

Because readout data buses 23a and 23b are wired along the long or short side of the semiconductor chip, the wiring capacitance thereof is great. In addition, many local sense amplifiers 21 are connected to the same readout data bus to result in a great value in collector capacitance. If readout data bus clamp transistors 40a and 40b are not utilized, resistors 39a and 39b are directly connected to readout data buses 23a and 23b. Voltage drop according to the current across resistors 39a and 39b influence the potentials of readout data buses 23a and 23b, whereby the potentials of readout data buses 23a and 23b will vary according to the magnitude of the current signal provided from local sense amplifier 21. For example, if the potential difference between readout data buses 23a and 23b corresponding to a readout data of logic "0" and a readout data of logic "1" is 0.5 V, the potentials of readout data buses 23a and 23b must be switched at a signal amplitude of 0.5 V in accordance with the readout data. As mentioned in the foregoing, readout data buses 23a and 23b have a great load capacitance C. This means that a period of time is required for charging/discharging of load capacitance C, not allowing rapid change in potentials of readout data buses 23a and 23b. As a result, change in output voltage is slow to lower the readout rate. On the other hand, if readout data bus clamp transistors 40a and 40b are used, potentials of readout data buses 23a and 23b are kept at a constant potential VCL, whereby charge/discharge of load capacitance C is eliminated to change the output voltage at high speed. This improves the readout rate significantly.

Referring to FIG. 8 again, sensing current crosses resistor 39a via readout data bus clamp transistor 40a in main sense amplifier 38. This causes the output of resistor 39a to be greater than that of resistor 39b in voltage drop by the sensing current component to provide a low level signal from transistor 40a.

The potential difference between resistors 39a and 39b is provided to an output buffer 47 via emitter-follower-transistors 41a and 41b and level shifting diodes 42a and 42b to end the reading operation of memory cell MC00.

When writing, the potential of one bit line of the pair is brought to a high level, and the potential of the other bit line is brought to a low level. For example, in order to write an invert data (data of logic "0") into memory cell MC00, output 32a of writing amplifier 31 is brought to a low level and 32b to a high level, whereby transistors 25 and 28 of writing driver 29 is rendered non-conductive, and transistors 26 and 27 rendered conductive. This causes I/O line 20a to attain a low level and I/O line 20b a high level to bring bit lines 6a and 6b to a low level and a high level, respectively. As a result, an invert data (data of logic "0") is written into memory cell MC00.

It is necessary for manufacturers to prepare various kinds of products in providing the above mentioned semiconductor memory devices to users. This necessity is due to the following reasons. The first reason is that variation in bit organizations of input/output data calls for a variety of types. If the bit organization of a system utilizing a semiconductor memory device is ×N (N is a positive integer of 1 and above), the semiconductor memory device must be able to input and output data by N bits. If the bit organization of the input/output data changes, it will become necessary to modify the number of pins and the internal circuit in a semiconductor memory device for data input/output. This results in a necessity of providing variety of types to suit each bit organization. The second reason is that the variety of packages where semiconductor chips are mounted calls for the provision of various types of semiconductor memory devices. FIGS. 10 and 11 show two typical types of packages. Package PA1 of FIG. 10 is called a DIP, in which input/output pins are arranged along the long side. A semiconductor chip SUC1 mounted on the package must have bonding pads arranged along the long sides to fit the package. Package PA2 of FIG. 11 is called a flat package having input/output pins arranged along the short sides. A semiconductor chip SUC2 mounted on that package must have bonding pads arranged along the short side to fit that package. Hence, various types of semiconductor memory devices must be prepared according to the types of packages to be mounted. The third reason is that the various operation modes (for example, nible mode, page mode in dynamic RAMs) employed by the system calls for various types of semiconductor memory devices. The locations of input/output data pins in a semiconductor memory device must be changed if the operation mode employed by the system is changed. It is therefore necessary to provide various types of semiconductor memory devices according to the employed operation mode.

The need to produce various types of semiconductor memory device products is a great load for manufacturers. For example, various types of semiconductor memory devices must be designed, and a production line must be provided for each type of semiconductor memory device. This will prevent reduction in the product cost of mass production, resulting in expensive products for the user. It is desirable to develop and manufacture a variety of products with minimum labor for manufacturers.

To satisfy the above requirements, some recent semiconductors are provided with several types of bonding pads arranged on the semiconductor chip for identical integration density, whereby the connection between the internal circuitry of the semiconductor integrated circuit device and the bonding pads are switched according to the usage environment. For example, FIG. 12 shows a semiconductor chip SUC3 provided with bonding pads BP1 suitable for a DIP and bonding pads BP2 suitable for a flat package. If semiconductor chip SUC3 is mounted on a DIP, the internal circuitry and bonding pads BP1 are connected. If semiconductor chip SUC3 is mounted on a flat package, the internal circuitry and bonding pads BP2 are connected. This allows the usage of the same semiconductor memory device in a plurality of environments to reduce load of manufacturers caused by increase in variety.

The methods of switching the connection between the internal circuitry of a semiconductor memory device and bonding pads take conventional methods such as those shown in FIGS. 13 and 14.

The method of FIG. 13 switches the connection between various types of bonding pads BP1-BPn and the internal circuitry at the time of the wiring step. This method is called master slicing.

The method of FIG. 14 inserts switches such as transfer gates TG1-TGn between a plurality of types of bonding pads PB1-PBn and the internal circuitry to switch connection between the bonding pads and the internal circuitry by the on/off thereof. This method is called bonding option, where external switching control signals of transfer gates TG1-TGn are applied to different bonding pads.

The above-mentioned switching method by master slicing or using transfer gates will be explained hereinafter in details applied to a SRAM of a Bi-CMOS.

According to increase in integration density, recent semiconductor memory devices usually have a structure where a memory cell array is divided into a plurality of blocks using divided word line techniques such as that disclosed in Japanese Patent Publication No. 62-28516. If a memory cell array is divided into a plurality of blocks, the number of bit line pairs connected to the same I/O line pair is reduced to increase the speed of access time. For the purpose of assisting design modification of semiconductor memory devices of different bit organizations, a plurality of local sense amplifiers (4–16, for example) are arranged in the same block to multiplex these outputs, allowing data input/output of a bit organization different from that in the semiconductor memory device.

FIGS. 15 and 16 are block diagrams showing the structures of semiconductor memory devices including the aforementioned block division and local sense amplifier division. In FIGS. 15 and 16, a memory cell array is divided into two blocks, each having two local sense amplifiers. FIG. 15 is an example of a x1 organization semiconductor memory device. FIG. 16 is an example of a x2 organization semiconductor memory device.

Referring to FIG. 15, a memory cell array is divided into a first block L and a second block R by word line division. The first block L and the second block R each comprise two sub-blocks. That is to say, the first block L comprises sub-blocks $70_{L1}$ and $70_{L2}$. The second block R comprises sub-blocks $70_{R1}$ and $70_{R2}$. Associated with sub-blocks $70_{L1}$, $70_{L2}$, $70_{R1}$ and $70_{R2}$, bit line actuating circuits $5_{L1}$, $5_{L2}$, $5_{R1}$, and $5_{R2}$, writing amplifiers $31_{L1}$, $31_{L2}$, $31_{R1}$, and $31_{R2}$, and local sense amplifiers $21_{L1}$, $21_{L2}$, $21_{R1}$, and $21_{R2}$ are provided. X address decoder 1 decodes an externally applied X address signal and provides the decoded signal to word line actuating circuit 2. In response, word line actuating circuit 2 actuates one word line of either the first block L or the second block R. Y address decoder decodes an externally applied Y address signals and applies the decoded signal to bit line actuating circuits $5_{L1}$, $5_{L2}$, $5_{R1}$, and $5_{R2}$. Each bit line actuating circuit opens the transfer gate of the selected bit line pair (refer to FIG. 5) according to the decoded signal from Y address decoder 4. Reading/writing control circuit 73 selectively actuates writing amplifiers $31_{L1}$, $31_{L2}$, $31_{R1}$ and $31_{R2}$, and local sense amplifiers $21_{L1}$, $21_{L2}$, $21_{R1}$ and $21_{R2}$. Decode circuit 78 decodes a selecting signal D for providing a control signal to comply the writing and reading system of the semiconductor memory device with external x1/internal x2 organization. A signal of the more significant several bits of the Y address applied to Y address decoder 4, for example, is used as selecting signal D. In case of internal x2 organization, the most significant bit (MSB) of the Y address is used. Decode circuit 78 provides selecting signal D and the inverted signal D! as control signals. ! indicates inversion in the present specification and drawings. Control signals D, D! are applied to a demultiplexer 79 and a multiplexer 81. Demultiplexer 79 provides the x1 data input to either of writing data buses $76_1$ or $76_2$ according to control signals D, D! from decode circuit 78. Writing data bus $76_1$ is connected to writing amplifiers $31_{L1}$ and $31_{R1}$. Writing data bus $76_2$ is connected to writing amplifiers $31_{L2}$ and $31_{R2}$. The outputs of local sense amplifiers $21_{L1}$ and $21_{R1}$ are applied to main sense amplifier $38_1$ via readout data bus $77_1$. The outputs of local sense amplifiers $21_{L2}$ and $21_{R2}$ are provided to main sense amplifier $38_2$ via readout data bus $77_2$. Multiplexer 81 is responsive to control signals D, D! from decode circuit 78 to multiplex and provide the outputs of main sense amplifiers $38_1$ and $38_2$ to output buffer 47. Thus, x1 data is provided from output buffer 47.

In the semiconductor memory device of FIG. 15, demultiplexer 79 provides the input data to either of data buses $76_1$ or $76_2$ according to control signals D, D! from decode circuit 78, when x1 data is applied to demultiplexer 79 at the time of writing. At this time, one memory cell in either of the sub-blocks is selected by X address decoder 1 and Y address decoder 4. Then, a writing sense amplifier corresponding to the sub-block of the selected memory cell is selectively enabled by reading/writing control circuit 73. x1 input data is written into the selected memory cell via the selectively enabled writing amplifier.

At the time of reading, a memory cell in either of the sub-blocks is selected by X address decoder 1 and Y address decoder 4. A local sense amplifier corresponding to the sub-block of the selected memory cell is selectively enabled by reading/writing control circuit 73.

Data readout from the selected memory cell is sensed in the corresponding local sense amplifier, and applied to either of main sense amplifiers $38_1$ or $38_2$ via either of readout data buses $77_1$ or $77_2$. At this time, multiplexer 81 is responsive to control signals D, D! from decode circuit 78 and switched to select and provide the output of either of main sense amplifiers $38_1$ or $38_2$ corresponding to the selected memory cell.

FIG. 16 shows a x2 organization semiconductor memory device in comparison with the x1 organization semiconductor memory device of FIG. 15. The structure of the semiconductor memory device of FIG. 16 is similar to that of FIG. 15 except for the points explained in the following. Corresponding elements have identical reference characters denoted, and the description thereof will not be repeated.

Referring to FIG. 16, input data of parallel 2 bits are directly applied to writing data buses $76_1$ and $76_2$ via input buffers $83_1$ and $83_2$, respectively. Data readout on readout data bus $77_1$ is amplified by a main sense amplifier $38_1'$ and provided via an output buffer $47_1'$. Similarly, data readout on readout data bus $77_2$ is amplified by a main sense amplifier $38_2'$ and provided via an output buffer $47_2'$.

In the semiconductor memory device of FIG. 16, either the first block L or the second block R of the memory cell array is selected at the time of data writing/reading. Corresponding two memory cells are selected simultaneously from the two sub-blocks of the selected block. The two bits of data, i.e. x2 input data supplied simultaneously from data input buffers $83_1$ and $83_2$ are written simultaneously into the two selected memory cells. At the time of reading, data readout from the corresponding two memory cells selected simultaneously are applied to main sense amplifiers $38_1'$ and $38_2'$ at the same time via readout data buses $77_1$ and $77_2$, respectively, and amplified.

The selection of x1 organization of FIG. 15 or the x2 organization of FIG. 16 for a semiconductor memory device is conventionally implemented with a mask option. All the functional blocks that can comply with both the x1 organization and the x2 organization are provided on one chip. By switching masks in wiring steps, for example, either the x1 organization or the x2 organization can be selected. That is to say, change in bit organization is performed by the aforementioned master slice method.

Change in bit organization realized by the mask option, i.e. the master slicing method poses various problems. For example, the master slicing method necessitates a plurality of masks in one step for production, due to switching carried out at the wiring step, to increase design and manufacturing costs. Another problem is that the semiconductor memory device cannot be used for a different bit organization after being manufactured.

Semiconductor memory devices switching the bit organization with the aforementioned bonding option has an advantage that it can be commonly used for several usage environments even after being manufactured. Such a semiconductor memory device is disclosed in U.S. Pat. No. 4,907,203, for example. This patent implements switching between x1 organization and x4 organization by switching the connections of the readout data buses and bonding pads with a signal switching circuit in a SRAM of a CMOS.

A structure of a semiconductor memory device is described hereinafter inferred from the technology of U.S. Pat. No. 4,907,203 applied to a SRAM of a Bi-CMOS of FIGS. 15 and 16.

FIG. 17 is a block diagram showing a structure of a SRAM of a Bi-CMOS. The semiconductor memory device of FIG. 17 is implemented to allow the control of switching between x1 organization and x2 organization from an external source. The major structure thereof is a combination of the structures of the semiconductor memory devices of FIGS. 15 and 16. Elements corresponding to those in the semiconductor memory devices of FIGS. 15 and 16 have identical reference characters denoted, and the description thereof will not be repeated.

Referring to FIG. 17, an external switching control signal for controlling the switching between x1 organization and x2 organization is applied to a buffer 86. The output of buffer 86 is applied to a data input selecting circuit 87. Data input selecting circuit 87 is responsive to the switching control signal from buffer 86 to selectively switch between the x1 data input from demultiplexer 79 and the x2 data input from input buffers $83_1$ and $83_2$, and provides the selected output to writing data buses $76_1$ and $76_2$.

Readout data buses $77_1$ and $77_2$ are connected to main sense amplifiers $138_1$ and $138_2$ for x1, and main sense amplifiers $138_1'$ and $138_2'$ for x2, respectively. The input stages of main sense amplifiers $138_1$, $138_2$, $138_1'$, and $138_2'$ are provided with current switching means $52_1$, $52_2$, $52_1'$, and $52_2'$, respectively. Current switching means $52_1'$ and $52_2'$ are supplied with a switching control signal from buffer 86 via a signal line 89. Current switching means $52_1$ and $52_2$ are supplied with a switching control signal via a signal line 90 which is inverted by inverter 88. Current switching means $52_1$, $52_2$, $52_1'$, and $52_2'$ serve to control the opening/closing of the current path between readout data buses $77_1$ and $77_2$ and each sense amplifier, in which the ON/OFF is controlled by a switching control signal and the inverted signal thereof supplied via signal lines 89 and 90. Main sense amplifiers $138_1$ and $138_2$ for x1 also functions to multiplex data of the two readout data buses $77_1$ and $77_2$. This multiplex function is controlled by control signals D and D! provided from decode circuit 78. Control signal D is provided to main sense amplifier $138_1$ and control signal D! is provided to main sense amplifier $138_2$. Main sense amplifiers $138_1$ and $138_2$ use a wired OR operation for the outputs, whereby the output is provided via output buffer 47.

FIG. 18 is a circuit diagram showing in detail the main feature of the semiconductor memory device of FIG. 17, i.e. the structure of main sense amplifier periphery. The main sense amplifier associated with readout data bus $77_1$ and the periphery thereof are shown.

Referring to FIG. 18, local sense amplifier $21_{L1}$ (or $21_{R1}$) is connected to readout data bus $77_1$. The structure of local sense amplifier $21_{L1}$ (or $21_{R1}$) is similar to that of local sense amplifier 21 of FIG. 5. Clamp potential generating circuit 133 is implemented with diode 34 having the anode connected to the first voltage supply 15; and a NMOS transistor 37 having the gate supplied with a reference potential for constant current generation via terminal 35, the drain connected to the cathode of diode 34 and a source connected to the second voltage supply 30. Transistor 37 implements a constant current source. Main sense amplifier $138_1$ for x1 is of the current detection type, connected to the two readout data lines 23a and 23b of readout data bus $77_1$ via PMOS transistors 52a and 52b in current switching means $52_1$.

More specifically, main sense amplifier $138_1$ is implemented with PMOS transistors $39a$ and $39b$, bipolar transistors $40a$, $40b$, $41a$, $41b$, and NMOS transistors $43$ and $44$. PMOS transistors $39a$ and $39b$ are used as variable resistors, having the source connected to first voltage supply 15 and the gate supplied with control signal D from decode circuit 78. Transistor $40a$ and $40b$ are transistors for clamping readout data bus $77_1$, having the bases supplied with the outputs of clamp potential generating circuit 133, the emitters connected to readout data lines $23a$ and $23b$ via PMOS transistors $52a$ and $52b$ in current switching means $52_1$, and the collectors connected to the drains of PMOS transistors $39a$ and $39b$. Transistors $41a$ and $41b$ are used as emitter-follower-transistors, having each collector connected to first voltage supply 15, each emitter connected to the input end of output data buffer 47, and each base connected to the drains of PMOS transistors $39a$ and $39b$, respectively. NMOS transistors 43 and 44 implement a current source, having its gate supplied with a reference potential for constant current source via terminal 35. The other main sense amplifier $138_2$ for x1 comprises a similar structure to that of the above mentioned main sense amplifier $138_1$. Main sense amplifier $138_2$ is connected to readout data bus $77_2$ via current switching means $52_2$ similar to current switching means $52_1$. Main sense amplifier $138_2$ is supplied with control signal D!. The outputs of main sense amplifiers $138_1$ and $138_2$ are connected to implement a wired OR to apply the output to data output buffer 47. NMOS transistors 45 and 46 implement a current source as the common load of main sense amplifiers $138_1$ and $138_2$. Each gates of transistors 45 and 46 is applied with a reference potential for constant current source via terminal 35.

The structures of a main sense amplifier for x2 and the peripheral circuit thereof are similar to those of the aforementioned main sense amplifier for x1 and the peripheral circuit thereof. Corresponding elements have a prime suffixed to the identical reference character. In the main sense amplifier for x2, main sense amplifier $138_1'$ and main sense amplifier $138_2'$ (refer to FIG. 17) are provided in parallel with one clamp potential generating circuit 133', where each output thereof is applied to output data buffers $47_1'$ and $47_2'$ (refer to FIG. 17), individually. Each gate of transistors $39a'$ and $39b'$ in main sense amplifier $138_1'$ is connected to second voltage supply 30 (also similar in main sense amplifier $138_2'$). This causes transistors $39a'$ and $39b'$ to be always conductive. Similar to the main sense amplifier of x1, main sense amplifier $138_1'$ for x2 is connected to the two readout data lines $23a$ and $23b$ of readout data line $77_1$ via PMOS transistors $52a'$ and $52b'$ of current switching means $52_1'$. Similarly, main sense amplifier $138_2'$ for x2 is connected to the two readout data lines of readout data line $77_2$ via current switching means $52_2'$ (refer to FIG. 17).

The operation of the semiconductor memory device of FIG. 17 and 18 is described hereinafter with particular reference to the characterizing readout operation of the semiconductor memory device.

It is assumed that the semiconductor memory device of FIGS. 17 and 18 is set to a readout state with I/O line $20a$ at a high level and $20b$ at a low level. Transistor $21a$ connected to I/O line $20a$ is conductive and transistor $21b$ connected to I/O line $20b$ is non-conductive at this time. Accordingly, sensing current flows through readout data line $23a$, but not through readout data line $23b$.

When a main sense amplifier for x1 is to be selected, an external switching control signal of a high level is provided to buffer 86. Current switching means $52_1$ and $52_2$ are supplied with a switching control signal of a low level via a signal line 90. Current switching means $52_1'$ and $52_2'$ are supplied with a switching control signal of a high level via a signal line 89. In response, transistors $52a$ and $52b$ in current switching means $52_1$ and $52_2$ become conductive. On the contrary, transistors $52a'$ and $52b'$ in current switching means $52_1'$ and $52_2'$ become non-conductive. This causes sensing current flowing through readout data buses $77_1$ and $77_2$ to flow only through main sense amplifiers $138_1$ and $138_2$ for x1.

In the main sense amplifier for x1, sensing current flows to PMOS transistor $39a$ via transistor $40a$ for clamping readout data buses. Therefore, the output of PMOS transistor $39a$ is greater than that of PMOS transistor $39b$ in voltage drop by the sensing current to provide a low level signal.

One of control signals D and D! is brought to a low level indicating selected state and the other brought to a high level indicating a non-selected state. The main sense amplifier supplied with the control signal of a high level indicating a non-selected state has both PMOS transistors $39a$ and $39b$ turned off, whereby the output potential thereof are dropped by sensing current or currents of current sources 43 and 44. The corresponding sense amplifier provides a signal of low level. For example, if control signal D! is a high level of non-selection, the corresponding main sense amplifier $138_2$ provides a low level signal.

The passage of sensing current through PMOS transistor $39a$ in the selected main sense amplifier $138_1$ generates a voltage drop determined by the ON resistance of PMOS transistor $39a$ used as a resistance load and the magnitude of sensing current and current of current source 43 to provide a low level signal from PMOS transistor $39a$. PMOS transistor $39b$ which is a companion to PMOS transistor $39a$ has only the current drawn from current source 44 to provide a signal of high level.

The potential difference between PMOS transistors $39a$ and $39b$ is provided via emitter-follower transistors $41a$ and $41b$. This output and the output of main sense amplifier $138_2$ go through wired OR operation to be provided to output buffer 47. This achieves the readout operation.

Main sense amplifiers $138_1'$ and $138_2'$ for x2 not used have terminal 35' supplied with voltage of a low level. This turns off transistors 37', 43', 44', 45', and 46' which serve as current sources. This can reduce the current consumption.

When main sense amplifiers $138_1'$ and $138_2'$ for x2 are to be selected, an external switching control signal of a low level is applied to buffer 86. Main sense amplifiers $138_1$ and $138_2$ for x1 are supplied with a switching control signal of a high level via signal line 90. Main sense amplifiers $138_1'$ and $138_2'$ for x2 are supplied with a switching control signal of a low level via signal line 89. This causes transistors $52a$ and $52b$ of current switching means $52_1$ and $52_2$ to become non-conductive, and transistors $52a'$ and $52b'$ in current switching means $52_1'$ and $52_2'$ to become conductive. Sensing current flowing through readout data lines $23a$ and $23b$ of readout data buses $77_1$ and $77_2$ flows through only main sense amplifiers $138_1'$ and $138_2'$ for x2. Because each output of main sense amplifiers $138_1'$ and $138_2'$ for x2 is separately provided to output buffers $47_1'$ and $47_2'$, respectively, main sense amplifiers $138_1'$ and $138_2'$ are always at a selected state. That is to say, the semiconductor memory device is implemented to provide simultanouesly data of two bits from two sense amplifiers $138_1'$ and $138_2'$. The other readout operation is similar to the case where main sense amplifiers $138_1$ and $138_2$ for x1 are selected.

The semiconductor memory device of FIGS. 17 and 18 is superior in adaptability in comparison with the aforementioned semiconductor memory device performing switching by master slicing, because the former can have the organization switched in accordance with the usage environment even after being manufactured. However, the semiconductor memory device of FIGS. 17 and 18 has a problem that the current switching means provided between the readout data bus and each main sense amplifier prevents increase in speed of readout rate by the readout data bus clamp transistor. This is because the voltage drop of the transistors (for example, PMOS transistors 52a, 52b) within the current switching means changes according to the current flowing through readout data buses to affect the potential of the readout data bus. If the potential of the readout data bus changes, charge/discharge with respect to load capacitance of the readout data bus occurs to reduce the readout rate.

SUMMARY OF THE INVENTION

An object of the present invention is to provide a semiconductor memory device that is superior in adaptability and capable of high speed readout.

A semiconductor memory device according to the present invention has the data readout from a memory cell amplified by a current output type local sense amplifier, and transmitted to a plurality of main sense amplifiers via the corresponding readout data bus. Each main sense amplifier is connected to a corresponding readout data bus via a clamp transistor for keeping the potential of the readout data bus always at a constant potential. The semiconductor memory device of the present invention includes switching control means for selectively switching a plurality of main sense amplifiers by controlling the control potential of each clamp transistor.

In accordance with the present invention, the main sense amplifier is selectively switched by controlling the control potential of the clamp transistor so that the potential of the readout data bus does not change to allow high speed readout.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
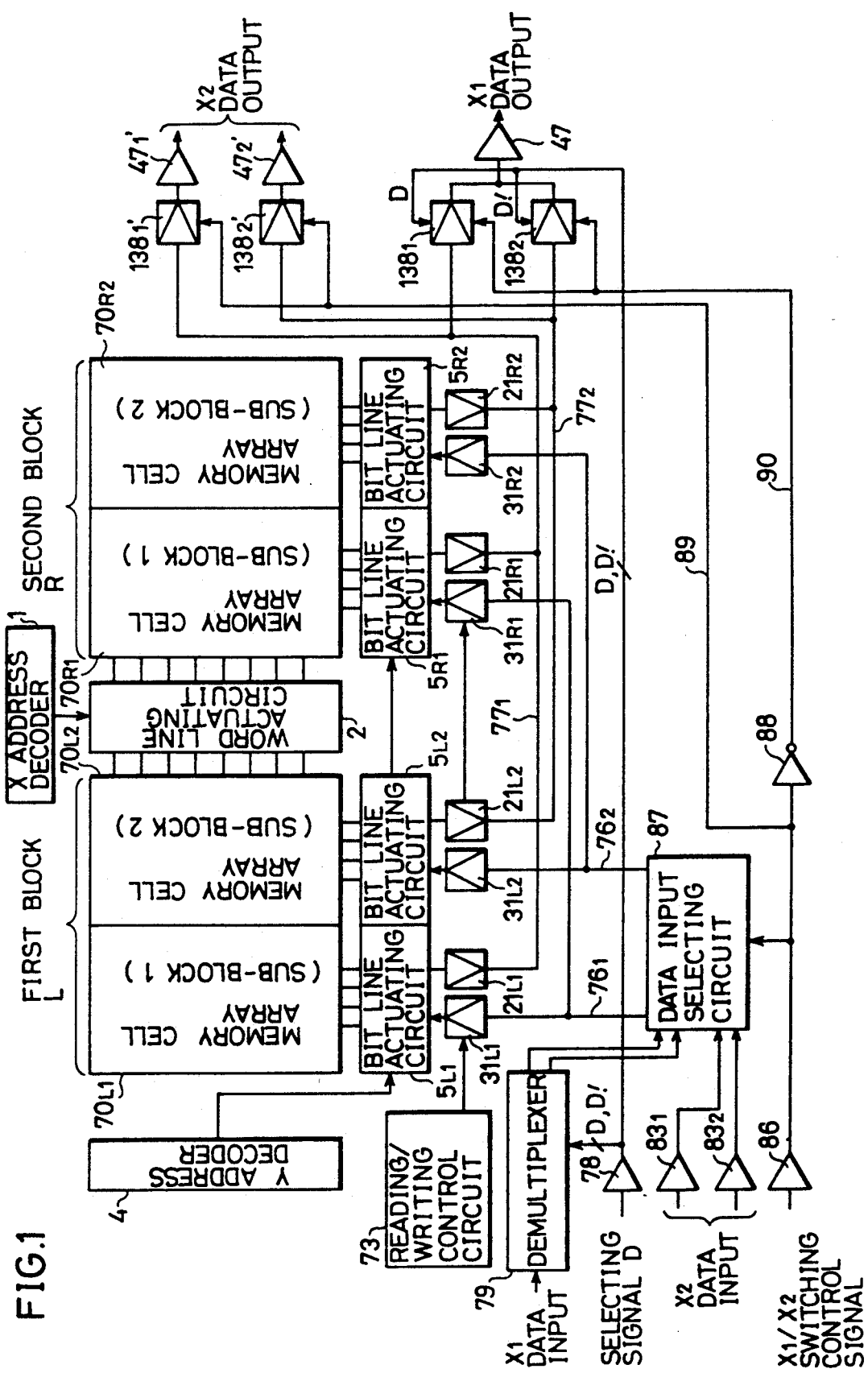
FIG. 1 is a block diagram showing the whole structure of an embodiment of the present invention.
Figure 2:
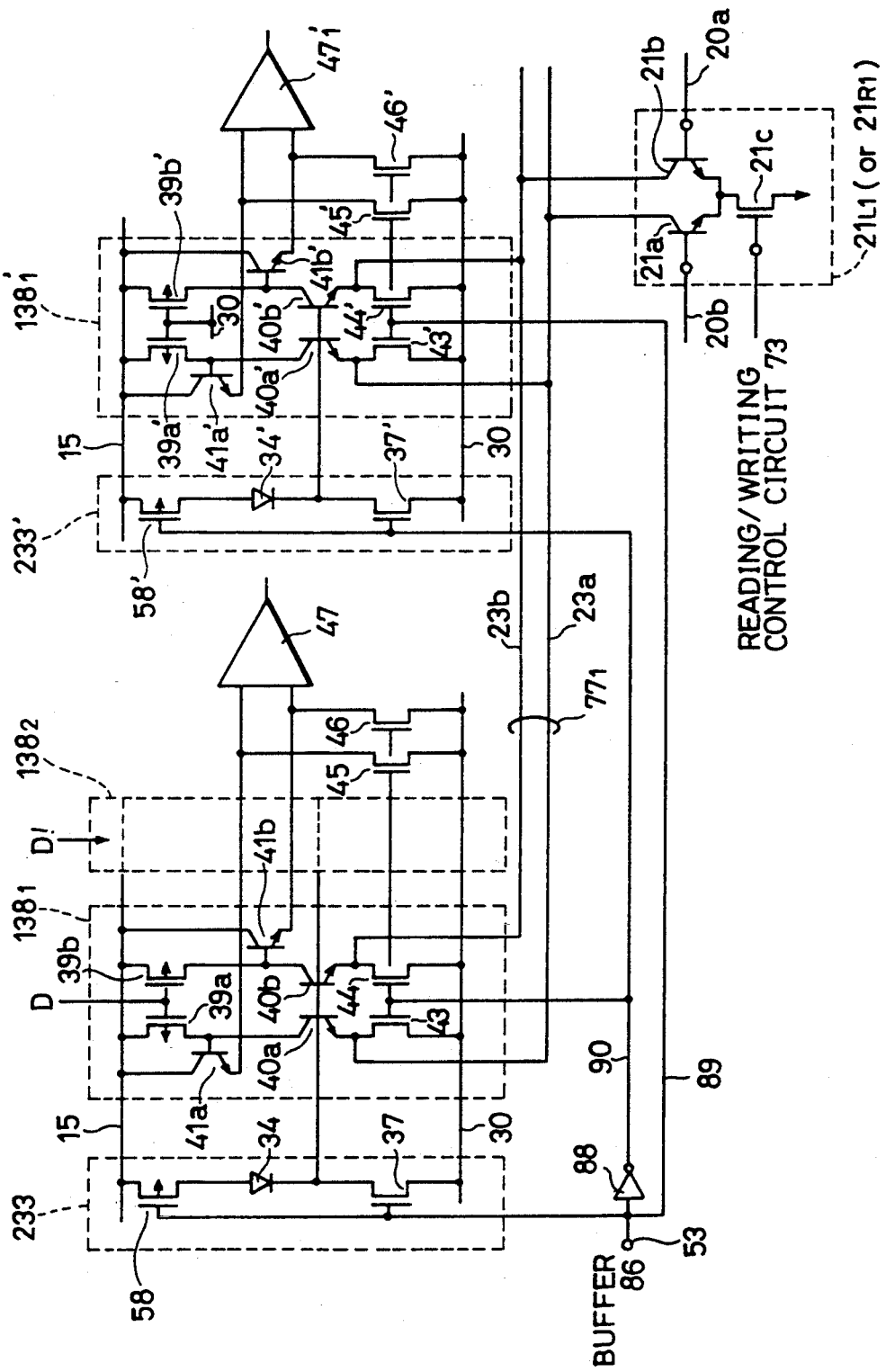
FIG. 2 is a circuit diagram showing the structure of the elements of the embodiment of FIG. 1.
Figure 17:
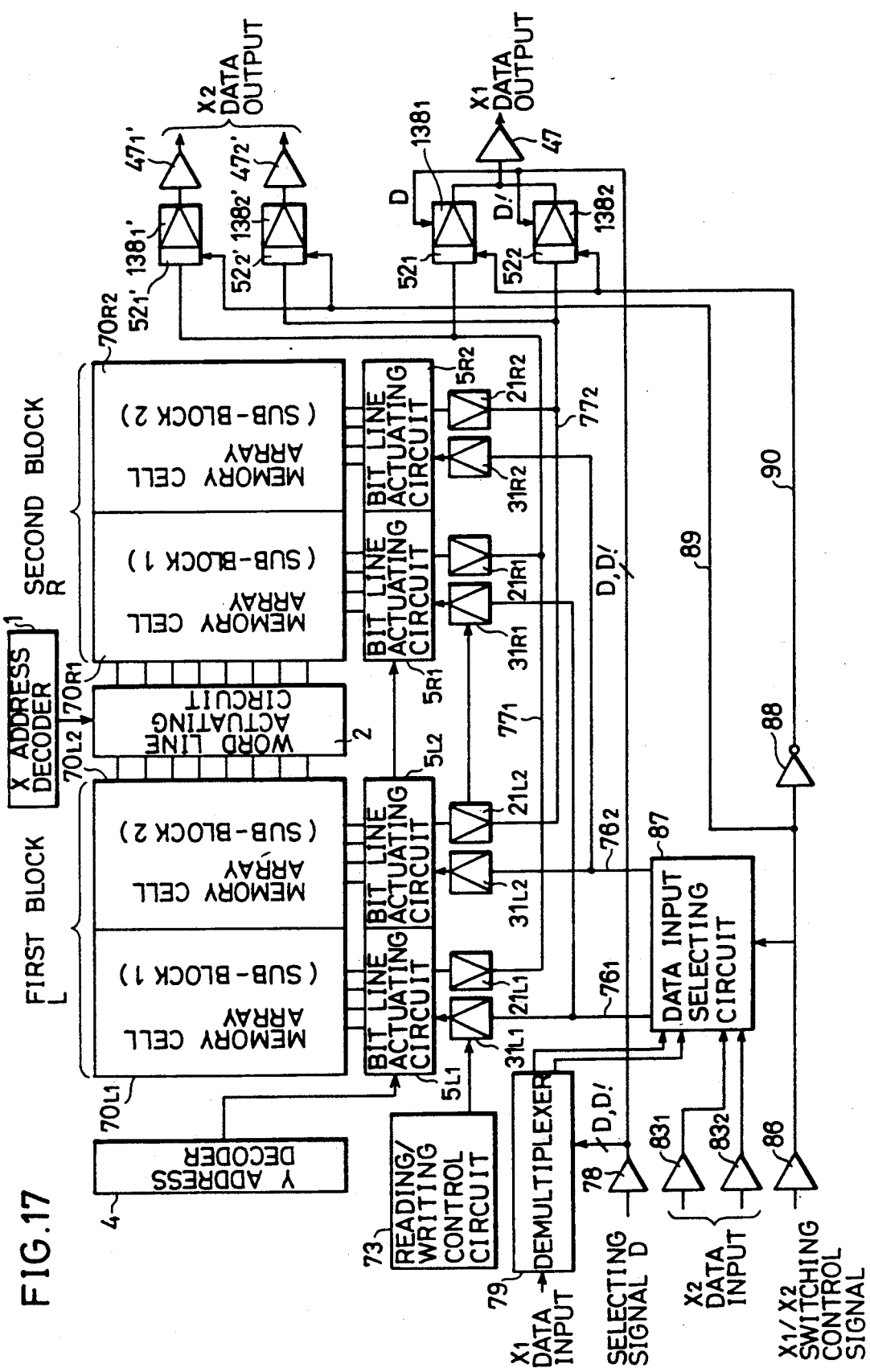
FIG. 17 is a block diagram showing a structure of a SRAM inferred from the bit organization switching technology disclosed in U.S. Pat. No. 4,907,203.
Figure 18:
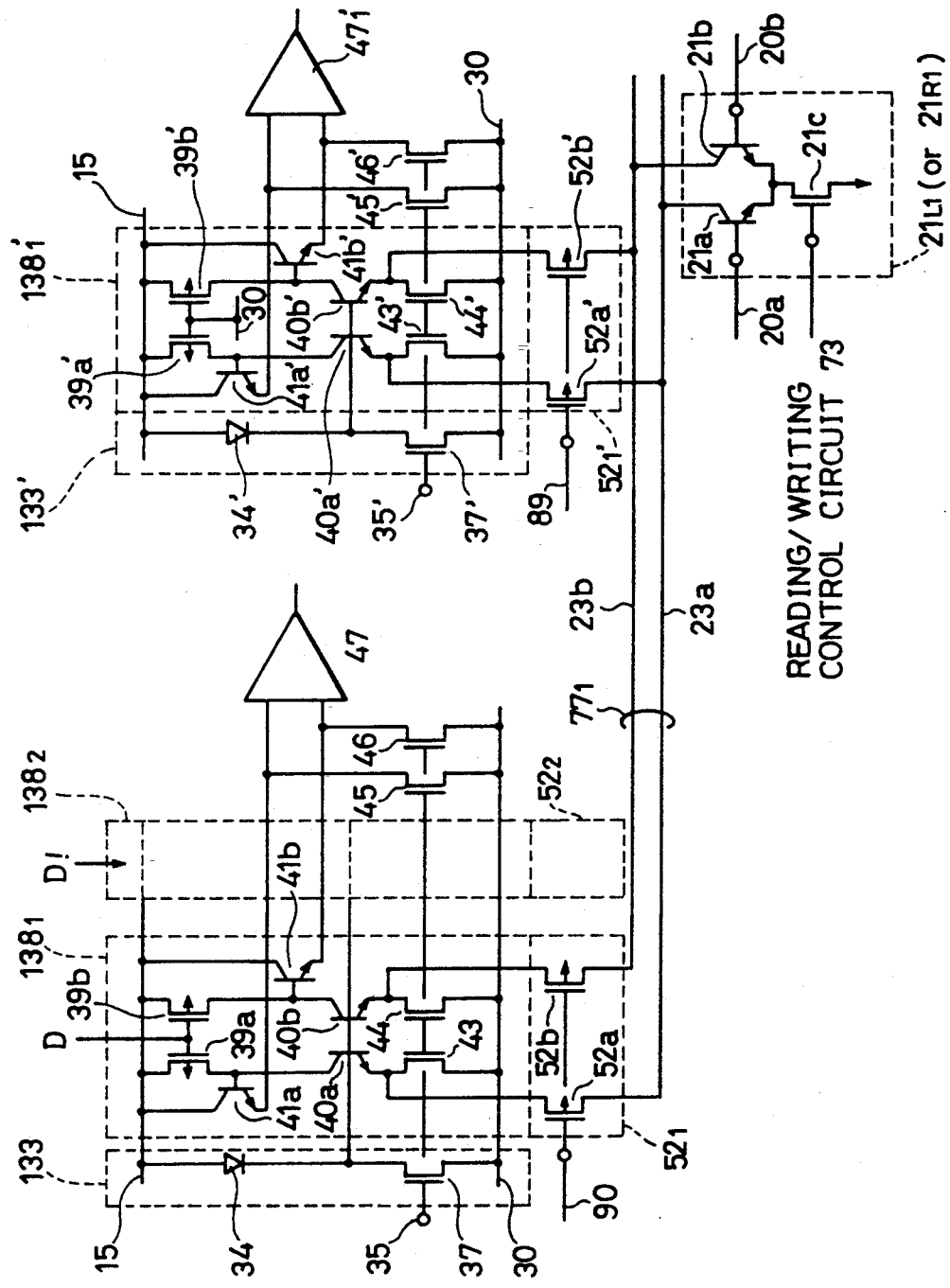
FIG. 18 is a circuit diagram showing the structure of elements of the semiconductor memory device of FIG. 17.

FIG. 1 is a block diagram of a structure of an embodiment of the present invention. FIG. 2 is a circuit diagram showing a structure of the elements of the embodiment of FIG. 1. Because the structures of the embodiment of FIGS. 1 and 2 are similar to those of the semiconductor memory device of FIGS. 17 and 18 except for the points explained in the following, corresponding elements have identical reference characters denoted, and the description thereof will not be repeated.

The embodiment of FIGS. 1 and 2 is implemented to selectively switch a main sense amplifier by controlling the base potential of a transistor for clamping the readout data bus. Referring to FIG. 2, clamp potential generating circuit 233 also serves as the switching control circuit of main sense amplifiers $138_1$ and $138_2$. Clamp potential generating circuit 233 comprises a PMOS transistor 58, a diode 34, and an NMOS transistor 37. Each gate of PMOS transistor 58 and NMOS transistor 37 is supplied with a switching control signal (the signal controlling the switching between x1 organization and x2 organization) from buffer 86 via terminal 53. PMOS transistor 58 has the source connected to first voltage supply 15, and the drain connected to the anode of diode 34. NMOS transistor 37 has the source connected to second voltage supply 30 and the drain connected to the cathode of diode 37. The clamp potential generating circuit 233' for x2 has a structure similar to that of clamp potential generating circuit 233 for x1. However, PMOS transistor 58' and NMOS transistor 37' included in clamp potential generating circuit 233' for x2 have the gates supplied with a switching control signal via signal line 90 which is inverted by inverter 88. Furthermore, the switching control signal inverted by inverter 88 is applied to each gate of transistors 43, 44, 45, and 46 serving as the current source via signal line 90. The switching control signal from buffer 86 is directly applied to each gate of transistors 43', 44', 45' and 46' serving as the current source via signal line 89. The structure of the remaining elements are similar to those of the semiconductor memory device of FIGS. 17 and 18.

The operation of the embodiment of the FIGS. 1 and 2 is described hereinafter. Assuming that the switching control signal of x1/x2 provided from buffer 86 is set to a low level, PMOS transistor 58 is ON, and NMOS transistor 37 is OFF. This causes a signal of a high level to be provided from clamp potential generating circuit 233. The switching control signal inverted by inverter 88 attains a high level to turn off PMOS transistor 58' and turn on NMOS transistor 37'. This results in a signal of a low level provided from clamp potential generating circuit 233'. Readout data bus clamp transistors 40$a$ and 40$a'$ are connected to the same readout data line 23$a$ to implement an ECL (Emitter Coupled Logic) in a pseudo manner. Similarly, readout data bus clamp transistors 40$b$ and 40$b'$ are connected to the same readout data line 23$b$ to implement an ECL in a pseudo manner. If the base potential of transistor 40$a$ is sufficiently higher than the base potential of transistor 40$a'$, sensing current crossing readout data line 23$a$ flow through transistor 40$a$. The same can be said of transistors 40$b$ and 40$b'$. This means that sensing current of readout data buses 77$_1$ and 77$_2$ flow through only the main sense amplifier selected by the switching control signal from buffer 86. The operation of the selected main sense amplifier is similar to that of the semiconductor memory device of FIGS. 17 and 18.

The embodiment of FIGS. 1 and 2 has the emitter of each readout data bus clamp transistor directly connected to the readout data bus, so that the potential of the readout data bus does not change even if current flows through the readout data bus. As a result, charge/discharge with respect to the load capacitance of the readout data bus does not occur at the time of reading out data to increase the speed of the readout rate.

Although clamp potential generating circuits 233 and 233' in the embodiment of FIGS. 1 and 2 are implemented so that the output amplitude is sufficiently great, a level of 0.3 V of output amplitude is appropriate, similarly to that of a normal ECL circuit. Therefore, the clamp potential generating circuit may have a circuit structure as that shown in FIG. 3.

Figure 3:
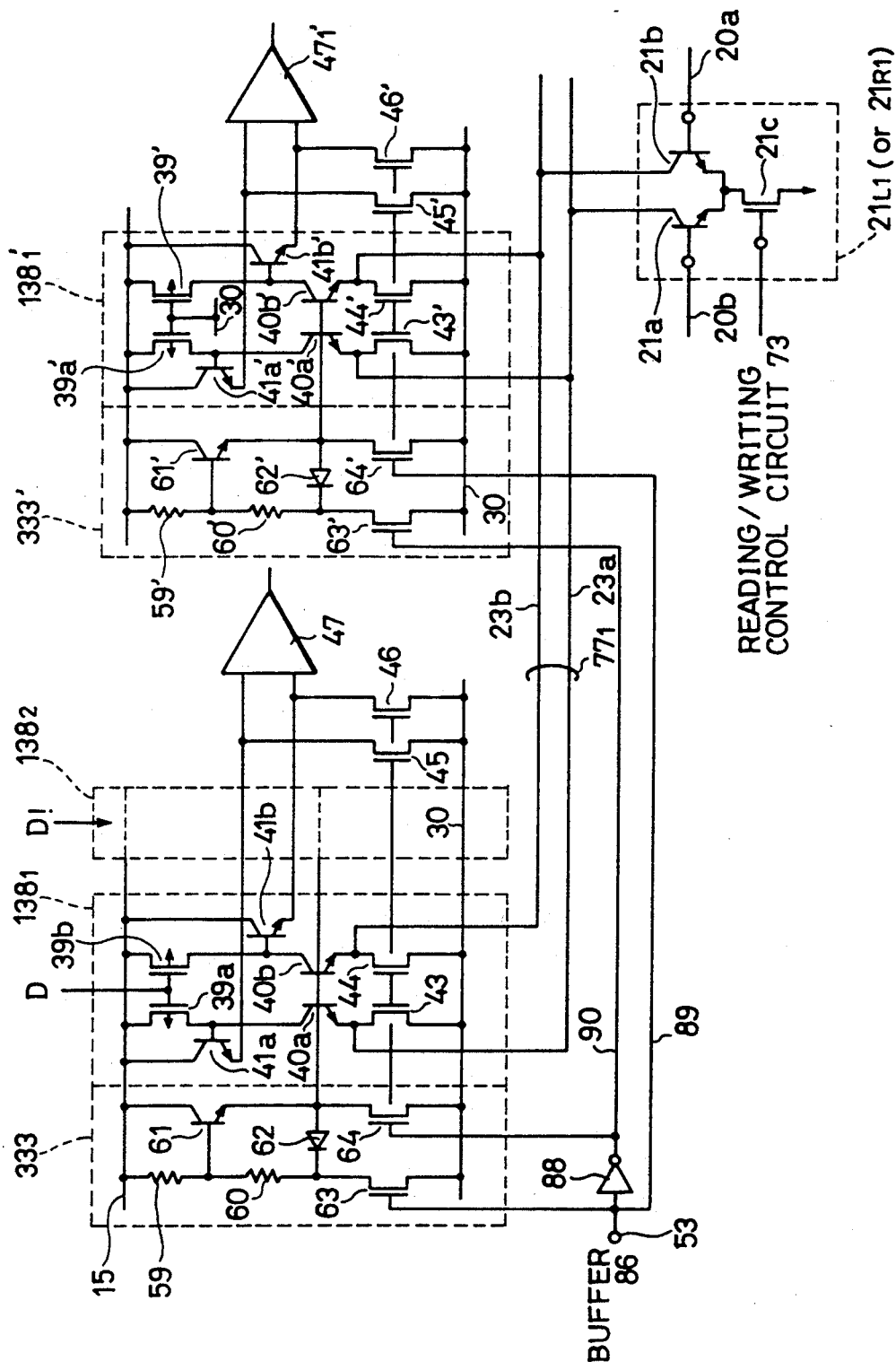
FIG. 3 is a circuit diagram showing a structure of elements of another embodiment of the present invention.

FIG. 3 is a circuit diagram showing the component structure of another embodiment of the present invention. The structure of clamp potential generating circuit 333 characterizing the present embodiment will be explained. Clamp potential generating circuit 333 comprises resisters 59 and 60, a bipolar transistor 61, a diode 62, and NMOS transistors 63 and 64. Resistor 59 has one end connected to first voltage supply 15 and the other end connected to one end of the second resistor 60. Transistor 61 has the collector connected to first voltage supply 15, the base connected to the contact of resistors 59 and 60, and the emitter connected to the output end of clamp potential generating circuit 333. Diode 62 has the anode connected to the emitter of transistor 61, and the cathode connected to the other end of resistor 60. NMOS transistor 63 is interposed between the cathode of diode 62 and the second voltage supply 30. NMOS transistor 64 is interposed between the anode of diode 62 and the second voltage supply 30.

The gate of NMOS transistor 63 is supplied with the switching control signal from buffer 86. The gate of NMOS transistor 64 is supplied with a switching control signal inverted by invertor 88. The clamp potential generating circuit 333' for x2 has a structure similar to that of clamp potential generating circuit 333 for x1, provided that NMOS transistor 63' is supplied with an inverted switching control signal via signal line 90, and NMOS transistor 64' is supplied with a direct switching control signal via signal line 89. This condition is opposite to that of the clamp potential generating circuit 333 for x1. Because the structure of the remaining components are identical to those of the embodiment of FIGS. 1 and 2, corresponding elements have identical reference characters denoted, and the description thereof will not be repeated.

The operation of the embodiment of FIG. 3 is explained hereinafter. When the switching control signal applied to input terminal 53 from buffer 86 is of low level, NMOS transistor 63 is OFF. Therefore, there is no voltage drop between resistors 59 and 60, whereby the output of clamp potential generating circuit 333 is a value reduced by the voltage between the base and the emitter of transistor 61. The output of clamp potential generating circuit 333 is at a high level at this time.

If the switching control signal applied to input terminal 53 is set to a high level, NMOS transistor 63 is ON. This causes voltage drop in resistors 59 and 60. Assuming that the forward voltage value of diode 62 is substantially equal to voltage VBE between the base-emitter of transistor 61, and the current value from current source 63 is sufficiently great, the output potential VCO of clamp potential generating circuit 333 is established by:

$$VCO = -VBE\{(2R1/R2)+1\}$$

where the resistance values of resistors 59 and 60 are R1 and R2, respectively. The values of resistance R1 and R2 are determined so that the value of output potential VCO exceeds the level of 0.3 V. The output of clamp potential generating circuit 333 is at a low level at this time.

Figure 4:
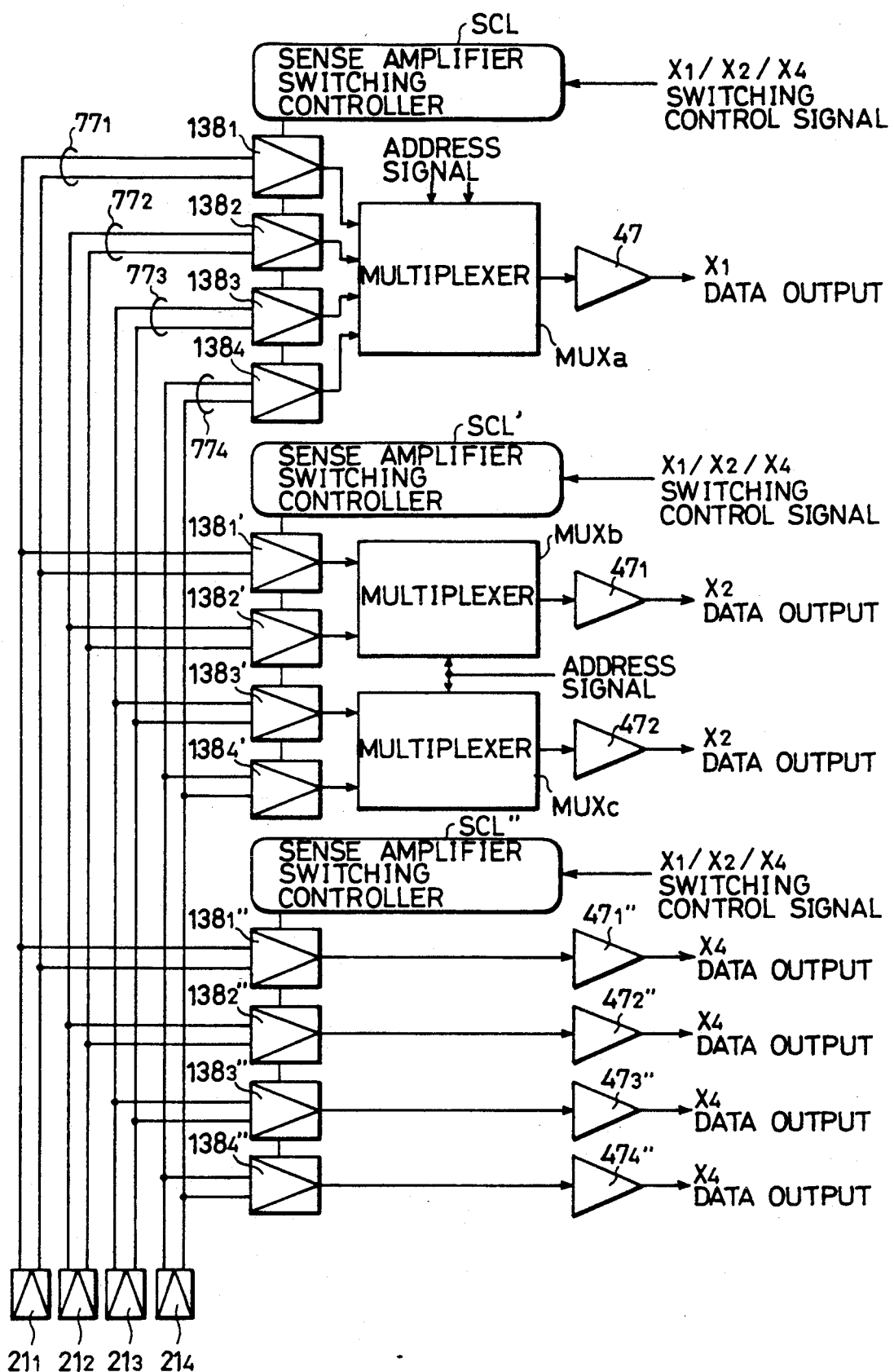
FIG. 4 is a block diagram showing a structure of the readout system of a further embodiment of the present invention.
Figure 5:
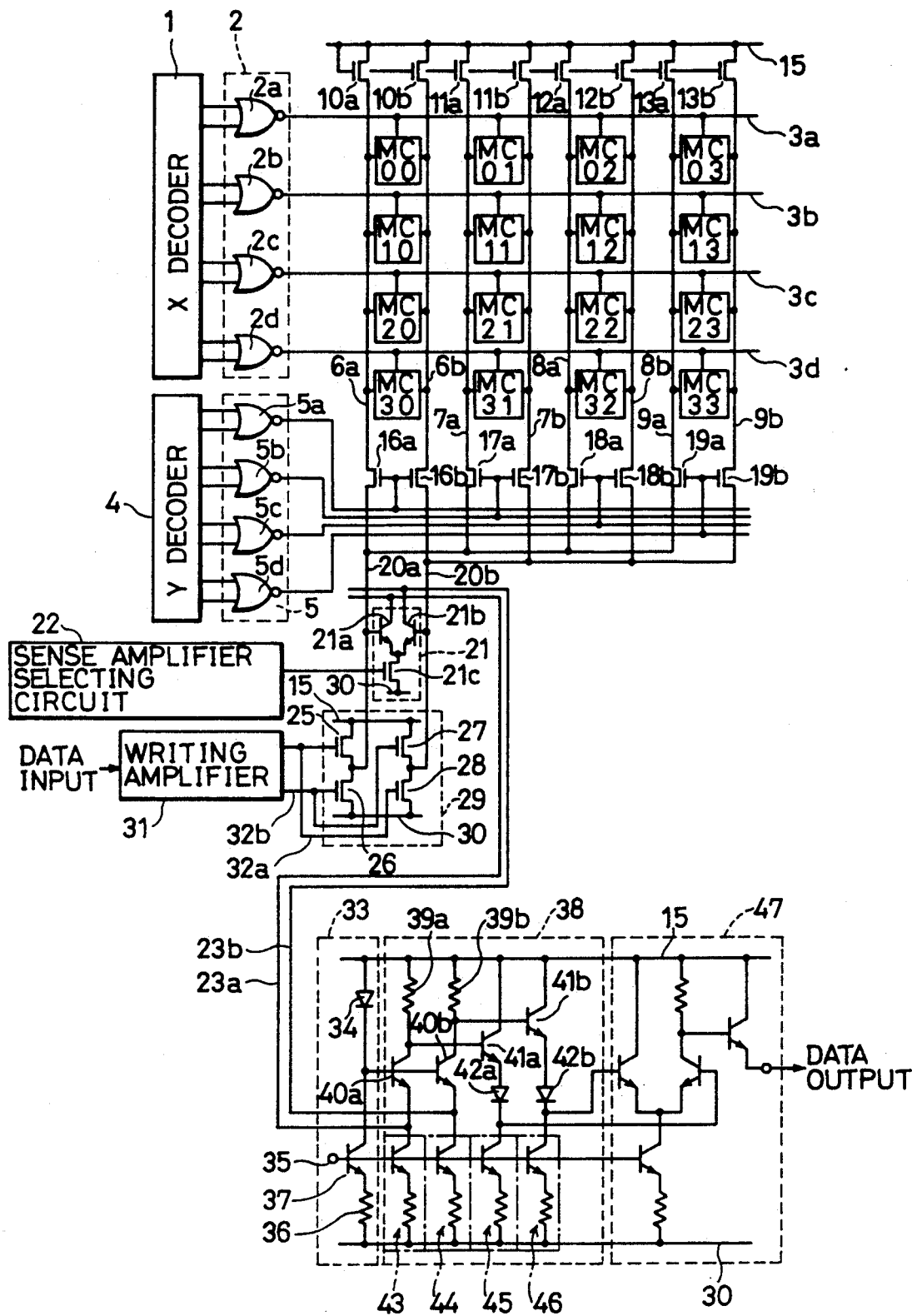
FIG. 5 is a circuit diagram showing a structure of a conventional Bi-CMOS SRAM.
Figure 6:
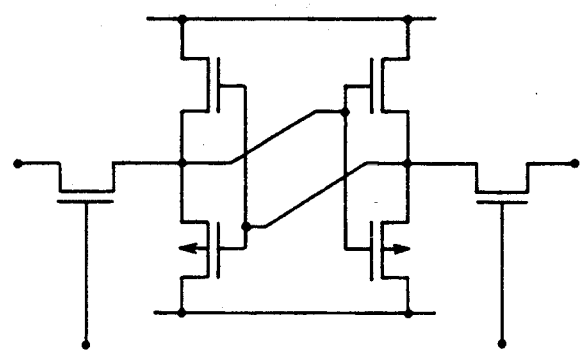
FIG. 6 is a circuit diagram showing an example of a memory cell used in a SRAM.
Figure 7:
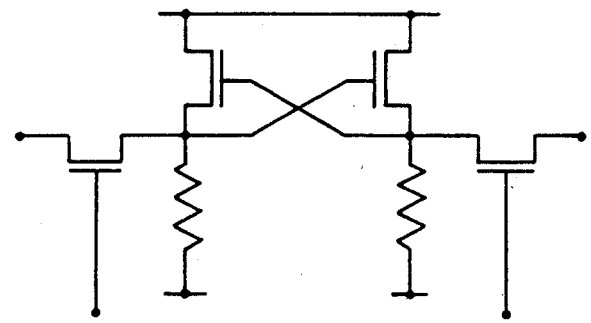
FIG. 7 is a circuit diagram showing another example of a memory cell used in a SRAM.
Figure 8:
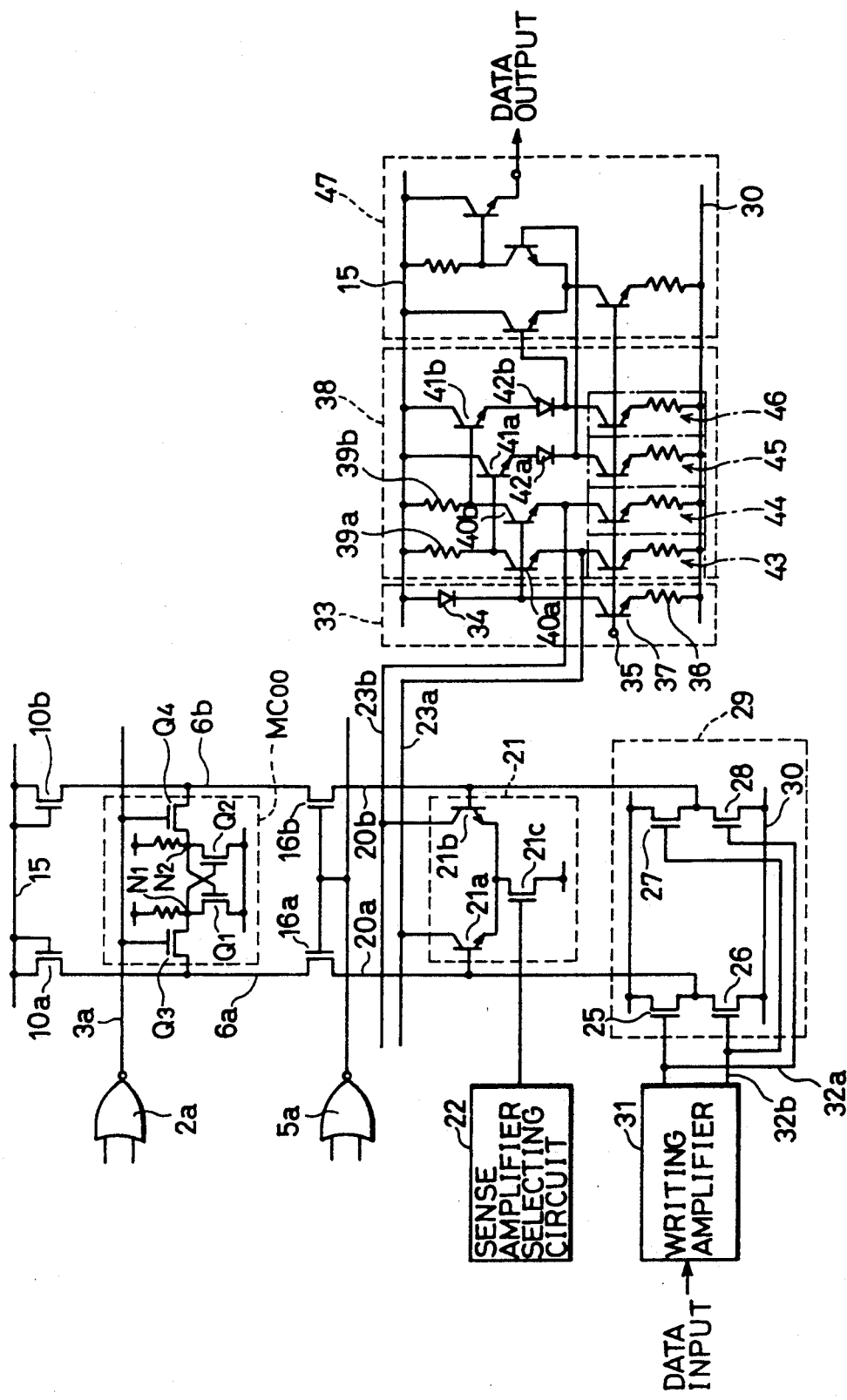
FIG. 8 is a circuit diagram of a portion of a readout system of the conventional SRAM of FIG. 5.
Figure 9:
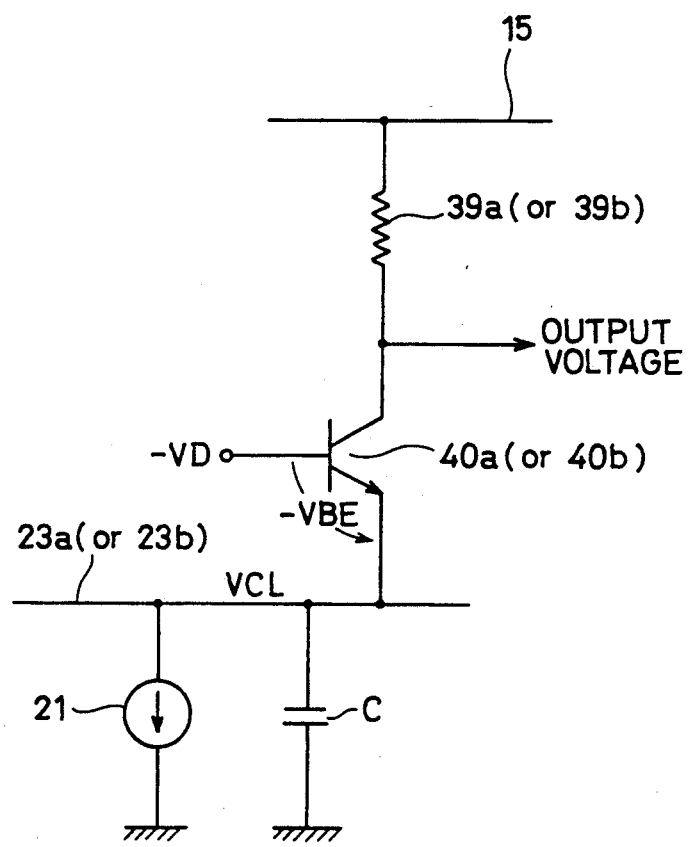
FIG. 9 is an equivalent circuit diagram for explaining the operation and advantage of the readout data bus clamp transistor used in a main sense amplifier.
Figure 10:
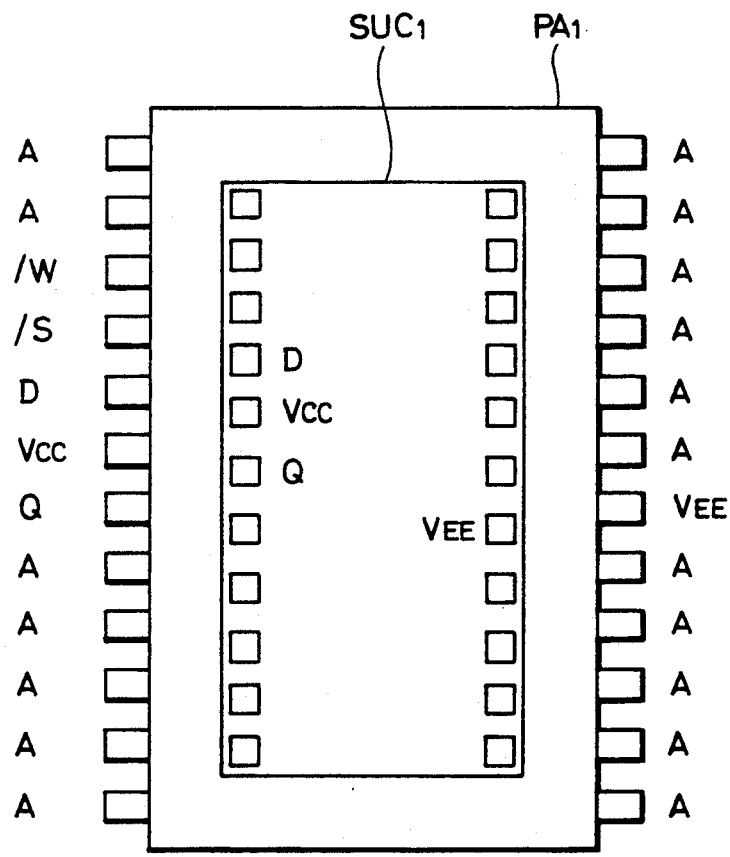
FIG. 10 is a diagram showing an example of a package where a semiconductor memory device is mounted.
Figure 11:
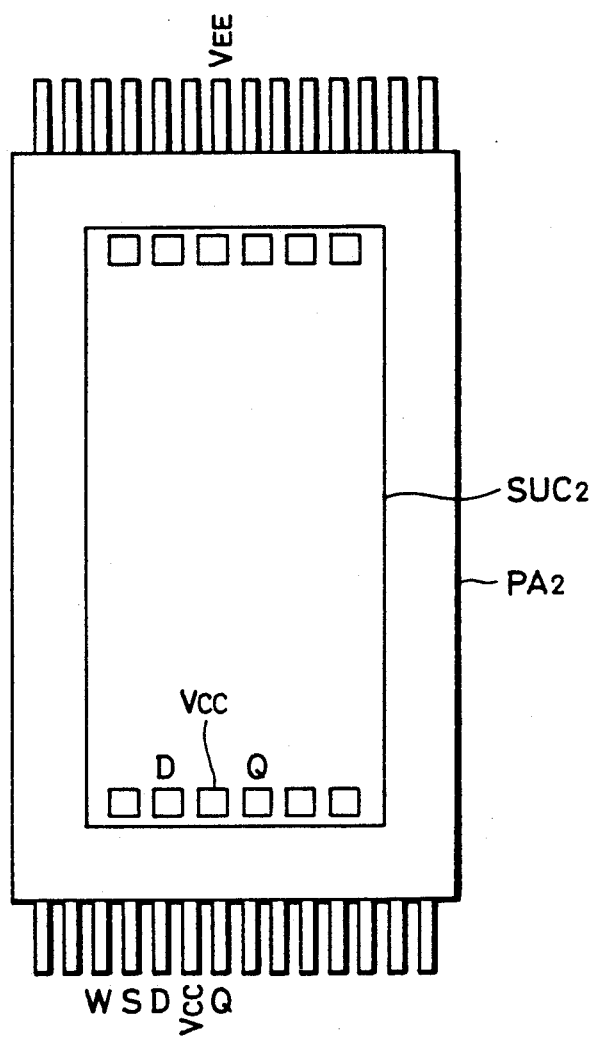
FIG. 11 is a diagram showing another example of a package where a semiconductor memory device is mounted.
Figure 12:
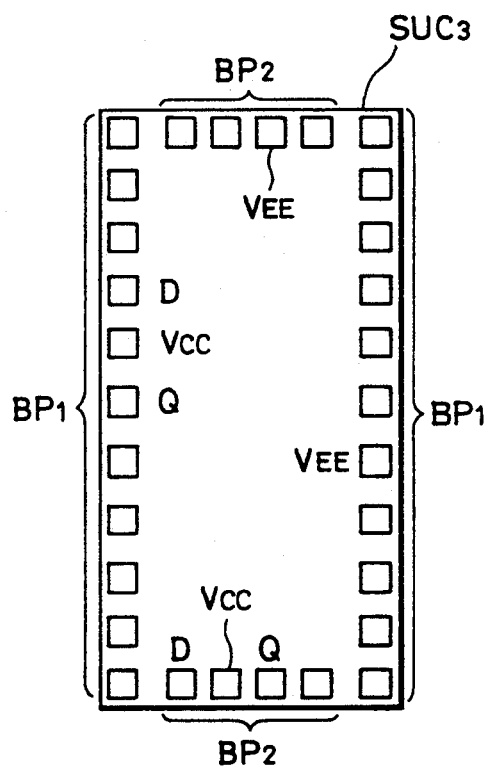
FIG. 12 is a diagram showing the arrangement of bonding pads on a semiconductor chip complying with a variety of packages.
Figure 13:
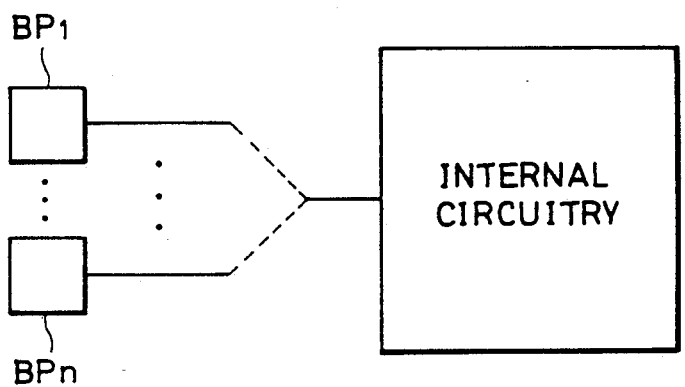
FIG. 13 is a schematic diagram for explaining the switching method of a semiconductor memory device by master slicing.
Figure 14:
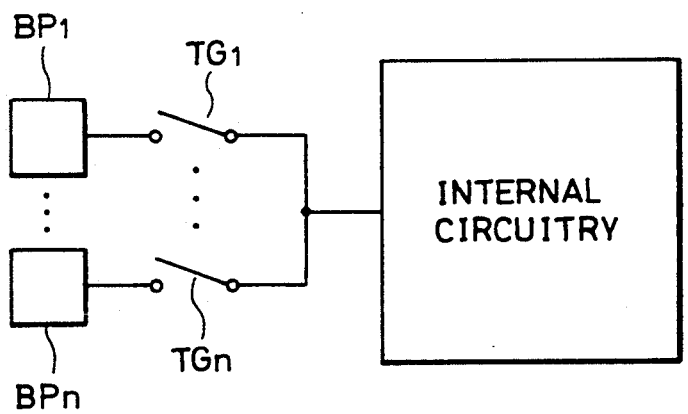
FIG. 14 is a schematic diagram for explaining the switching method of a semiconductor memory device by bonding option.
Figure 15:
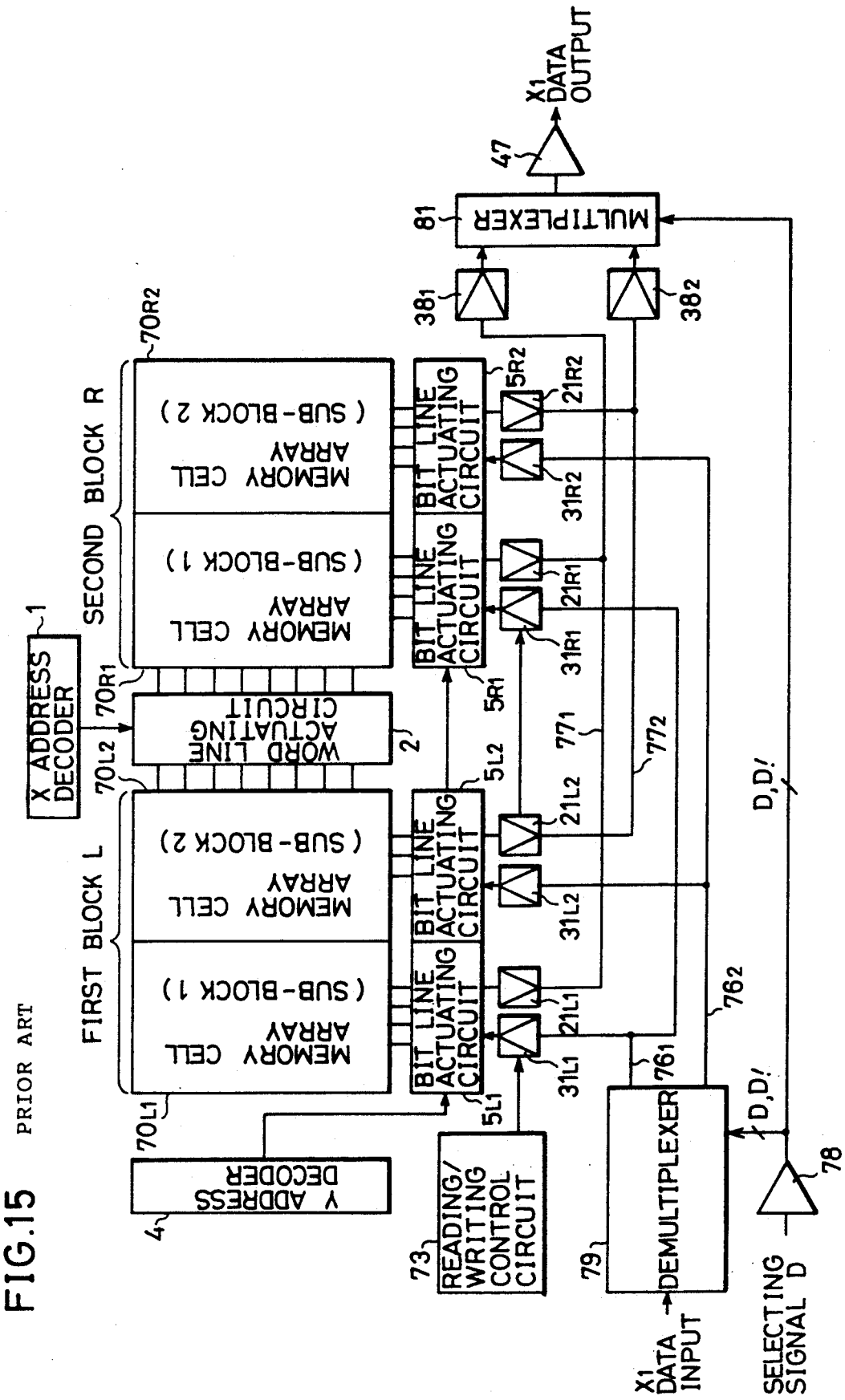
FIG. 15 is a block diagram showing a conventional SRAM of x1 organization that is word line divided.
Figure 16:
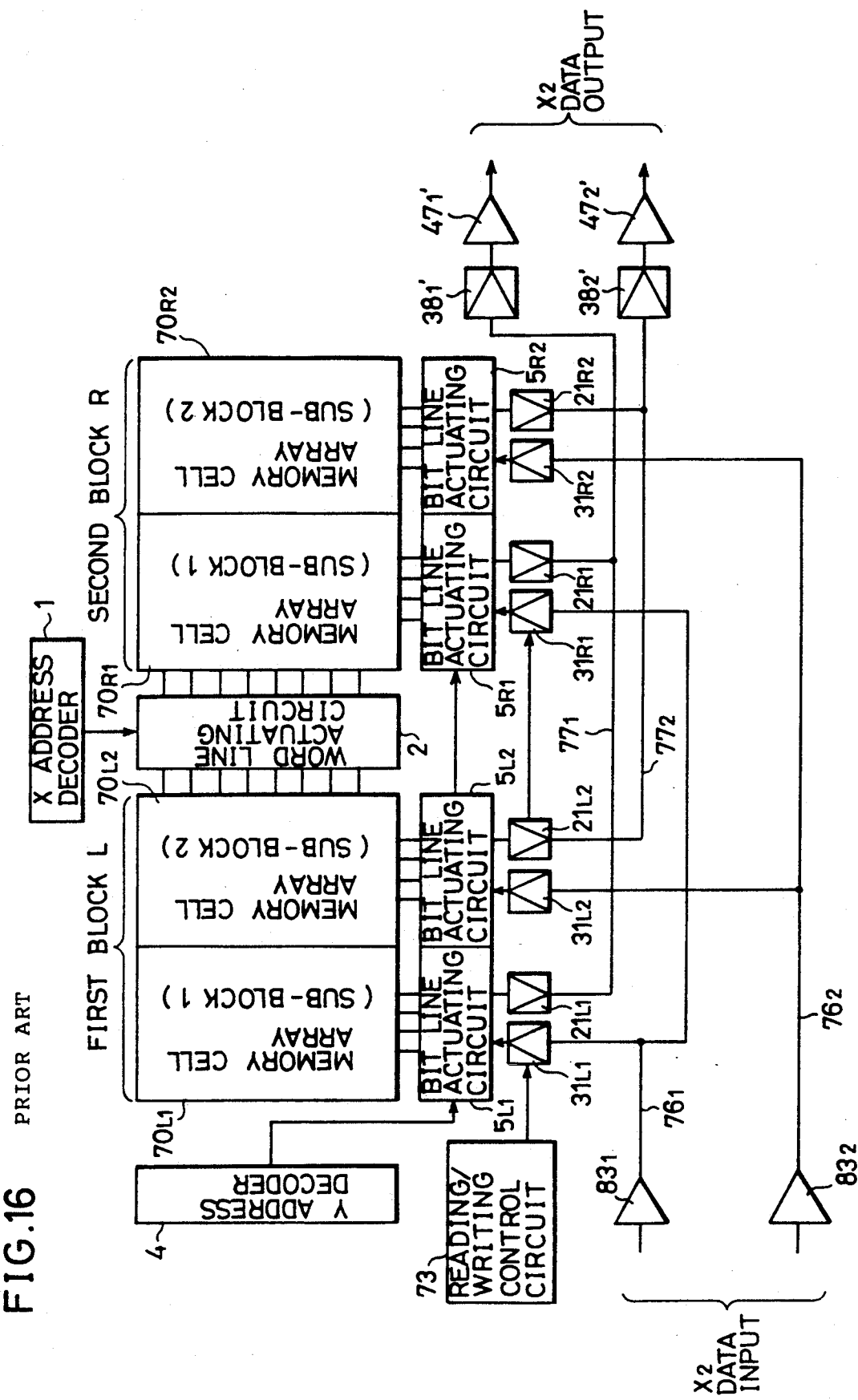
FIG. 16 is a block diagram showing a conventional SRAM of x2 organization that is word line divided.

FIG. 4 is a block diagram showing the structure of components of a further embodiment of the present invention. The embodiment of FIG. 4 is implemented to switch to x1 data output, x2 data output, or x4 data output.

Referring to FIG. 4, local sense amplifiers 21$_1$–21$_4$ are current output type amplifiers for amplifying data read out simultaneously from different sub-blocks of a memory cell array and converting the same into a current signal. The output of local sense amplifiers 21$_1$–21$_4$ is applied to readout data buses 71$_1$–77$_4$, respectively. Main sense amplifiers 138$_1$–138$_4$ for x1, main sense amplifiers 138$_1'$–138$_4'$ for x2, and main sense amplifiers 138$_1''$–138$_4''$ for x4 are connected to readout data buses 77$_1$–77$_4$. The structure of each main sense amplifier may be similar to that of the embodiment of FIGS. 2 and 3. Each main sense amplifier is provided with a readout data bus clamp transistor (40$a$, 40$b$, 40$a'$, 40$b'$) such as that shown in FIGS. 2 and 3. Each base of readout data bus clamp transistors of main sense amplifiers 138$_1$–138$_4$ for x1 is supplied with the output of a sense amplifier switching controller SCL. Sense amplifier switching controller SCL operates in response to a switching control signal of x1/x2/x4. Similarly, the base of each readout data bus clamp transistor in main sense amplifiers $138_1'$-$138_4'$ for x2 is supplied with the output of a sense amplifier switching controller SCL'. The base of each readout data bus clamp transistor in main sense amplifiers $138_1''$-$138_4''$ for x4 is supplied with the output of a sense amplifier switching controller SCL''. Sense amplifier switching controllers SCL' and SCL'' operate in response to the switching control signal of x1/x2/x4.

The outputs of main sense amplifiers $138_1$-$138_4$ are applied to a multiplexer MUXa. Multiplexer MUXa is supplied with a control signal such as a signal of the most significant 2 bits of a Y address signal, for example. Multiplexer MUXa is responsive to the control signal of 2 bits to sequentially select and provide the output of main sense amplifiers $138_1$-$138_4$. The output of multiplexer MUXa is applied to a data output terminal for x1 (not shown) via output buffer 47.

The outputs of main sense amplifiers $138_1'$ and $138_2'$ are provided to a multiplexer MUXb. The outputs of main sense amplifiers $138_3'$ and $138_4'$ are provided to a multiplexer MUXc. Multiplexers MUXb and MUXc are supplied with a control signal such as a signal of the most significant 1 bit of a Y address signal. Multiplexer MUXb is responsive to the above mentioned control signal to sequentially switch and provide the output of main sense amplifiers $138_1'$ and $138_2'$. The output of multiplexer MUXb is applied to a data output terminal for x2 (not shown) via an output buffer $47_1'$. Similarly, multiplexer MUXc is responsive to the above mentioned control signal to sequentially switch and provide the output of main sense amplifiers $138_3'$ and $138_4'$. The output of multiplexer MUXc is applied to a data output terminal for x2 (not shown) via an output buffer $47_2'$.

The outputs of main sense amplifiers $138_1''$-$138_4''$ are directly applied to a data output terminal for x4 (not shown) via output buffers $47_1''$-$47_4''$.

The operation of the embodiment of FIG. 4 will be explained hereinafter. The operation when a x1 data output is selected by a switching control signal of x1/x2/x4 will be explained. Sense amplifier switching controller SCL applies a reference potential for clamping to each base of the readout data bus clamp transistor in main sense amplifiers $138_1$-$138_4$. Each readout data bus clamp transistor of main sense amplifiers $138_1$-$138_4$ are ON to clamp the potential of readout data buses $77_1$-$77_4$ to a constant current. As a result, data provided from local sense amplifiers $21_1$-$21_4$ are amplified by main sense amplifiers $138_1$-$138_4$, converted to a voltage signal, and applied to multiplexer MUXa. Multiplexer MUXa sequentially selects the outputs of main sense amplifiers $138_1$-$138_4$ and provides the same to output buffer 47. Thus, x1 data is provided from output buffer 47. The other sense amplifier switching controllers SCL' and SCL'' control each readout data bus clamp transistor in main sense amplifiers $138_1'$-$138_4'$ and $138_1''$-$138_4''$ to attain a conductive state. This suppresses the output of x2 data and x4 data.

When x2 data output is selected by switching control signal x1/x2/x4, only the readout data bus clamp transistors in main sense amplifiers $138_1'$-$138_4'$ are rendered conductive, and the readout data bus clamp transistors in other main sense amplifiers $138_1$-$138_4$ and $138_1''$-$138_4''$ are rendered non-conductive. The readout data provided from local sense amplifiers $21_1$-$21_4$ pass only through main sense amplifiers $138_1'$-$138_4'$. Multiplexers MUXb and MUXc derive output signals of 2 bits from main sense amplifiers $138_1'$-$138_4'$ and provide the same to output data buffers $47_1'$ and $47_2'$. Thus, x2 data is provided from output buffers $47_1'$ and $47_2'$.

When x4 data output is selected by switching control signal of x1/x2/x4, only the readout data bus clamp transistor in main sense amplifiers $138_1''$-$138_4''$ is rendered conductive by sense amplifier switching controller SCL''. The readout data bus clamp transistors in other main sense amplifiers $138_1$-$138_4$ and $138_1'$-$138_4'$ are rendered non-conductive. The readout data provided from local sense amplifiers $21_1$-$21_4$ pass through only main sense amplifiers $138_1''$-$138_4''$ and are applied to output buffers $47_1''$-$47_4''$. Thus, x4 data output is provided from output buffers $47_1''$-$47_4''$.

The above embodiment is by way of example only and the switching of bit organization can be carried out in arbitrary combination in the present embodiment.

The present invention is not limited to the above mentioned embodiment where bit organization switching is carried out in response to a switching control signal. It is possible to selectively switch the main sense amplifier according to the type of packages and the operation mode of the system. For example, a main sense amplifier corresponding to each package for each readout data bus may be provided to comply with a variety of packages, and selectively switch the main sense amplifiers by controlling the control potential (base potential) of the readout data bus clamp transistor in each main sense amplifier in response to a switching control signal.

The present invention is not limited to a SRAM and is applicable to other types of semiconductor memory devices (for example are dynamic RAM). The present invention is also applicable to a semiconductor memory device where word line division is not applied.

Although the above mentioned embodiment is implemented with a switching control signal of a main sense amplifier applied from external source of the semiconductor memory device, the semiconductor memory device may be implemented to generate a switching control signal internally.

Although a bipolar transistor is used as a transistor for clamping a readout data bus in the above described embodiment, other elements, for example a MOS transistor, may be used.

In accordance with a present invention, the internal structure of a semiconductor memory device may be switched according to the usage environment even after being manufactured. Because the switching is carried out by controlling the control potential of a clamp transistor, it is possible to directly connect the clamp transistor to a readout data bus. Therefore, the readout data bus is always clamped to a constant potential by the clamp transistor to eliminate discharge/charge with respect to load capacitance of a readout data bus at the time of data readout, to increase the speed of the output rate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device wherein data readout from a memory cell is amplified by a current output type local sense amplifier to supply a locally amplified data signal that is transmitted to a plurality of main sense amplifiers via corresponding readout data buses,
wherein each of said main sense amplifiers is connected to a corresponding readout data bus via transistor clamp means for keeping a potential of said readout data bus at a substantially constant potential,
said semiconductor memory device comprising switching control means for selectively switching said plurality of main sense amplifiers by controlling the control potential of each of said transistor clamp means.

2. The semiconductor memory device according to claim 1, wherein a plurality of said local sense amplifiers and said readout data buses are provided, with a plurality of main sense amplifiers coupled to each readout data bus,
wherein data readout simultaneously from a plurality of memory cells are amplified by the corresponding local sense amplifiers, respectively, and transmitted to the corresponding plurality of main sense amplifiers via the respective corresponding one pair of said readout data buses.

3. The semiconductor memory device according to claim 2, wherein said switching control means selectively switches the corresponding plurality of main sense amplifiers of the respective said plurality of pairs of readout data buses.

4. The semiconductor memory device according to claim 3, further comprising output control means for providing the output of said plurality of main sense amplifiers selected simultaneously by said switching control means in a predetermined bit organization.

5. The semiconductor memory device according to claim 4, wherein said output control means comprises multiplex means for switching the output of said plurality of main sense amplifiers in a time-division manner.

6. The semiconductor memory device according to claim 4, wherein said output control means comprises
means for providing the output of said plurality of main sense amplifiers directly in parallel, and
multiplex means for switching the output of said plurality of main sense amplifiers in a time-division manner.

7. The semiconductor memory device according to claim 1, including a plurality of types of output terminals provided corresponding to the types of packages where said semiconductor memory device is mounted,
wherein the outputs of said plurality of main sense amplifiers are applied to the output terminals of the respective corresponding package.

8. The semiconductor memory device according to claim 1, wherein each of said main sense amplifiers comprises a current source transistor for applying current from a voltage supply,
wherein said switching control means simultaneously controls the control potentials of each of said clamp transistors and each of said current source transistors to block the application of current to non-selected main sense amplifiers.

9. The semiconductor memory device according to claim 1, wherein said switching control means is responsive to a switching control signal for enabling only a selected main sense amplifier.

10. The semiconductor memory device according to claim 9, wherein said switching control signal is applied from an external source.

11. The semiconductor memory device according to claim 9, wherein said switching control signal is generated within said semiconductor memory device.

12. The semiconductor memory device according to claim 1, further comprising clamp potential generating means for generating control potential of each said clamp transistor,
said switching control means comprising means for switching the output potential of said clamp potential generating means.

13. The semiconductor memory device according to claim 1, wherein each said clamp means comprises a bipolar transistor.

14. A semiconductor memory device capable of changing the bit organization of input/output data comprising:
a memory cell array including a plurality of memory cells,
readout means for simultaneously reading out data of a plurality (N) of bits (N is an integer of 2 and above) from said memory cell array,
a plurality of local sense amplifiers for amplifying each of N bits of data readout by said readout means to convert the same into a current signal of N bits,
a plurality of (N) bits of readout data buses for transmitting said current signal output of N bits of said local sense amplifiers, and
a plurality of pairs of readout data output means provided in parallel with each other, each receiving said current signal output of N bits transmitted by said N readout data buses,
wherein each of said readout data output means comprises
a plurality of (N) main sense amplifiers for amplifying each current signal of N bits provided via said N readout data buses and converting the same into a voltage signal, each of said main sense amplifiers connected to a corresponding readout data bus via transistor clamp means for keeping the potential of the corresponding readout data bus always constant, and
output control means for providing the outputs of the corresponding plurality of main sense amplifiers at a predetermined bit organization, and
control means for enabling only said plurality of main sense amplifiers included in said selected pair of readout data output means, by controlling the control potential of each of said transistor clamp means.

15. The semiconductor memory device according to claim 1, said transistor clamp means comprising a transistor.

16. The semiconductor memory device according to claim 1, said clamp means comprising a pair of transistors.

17. The semiconductor memory device according to claim 1, wherein each of said means sense amplifiers include a pair of complementary outputs.

* * * * *